United States Patent
Memis

[19]

[11] Patent Number: 6,162,997
[45] Date of Patent: *Dec. 19, 2000

[54] CIRCUIT BOARD WITH PRIMARY AND SECONDARY THROUGH HOLES

[75] Inventor: Irving Memis, Vestal, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/868,090

[22] Filed: Jun. 3, 1997

[51] Int. Cl.$^7$ ...................................................... H01B 7/00
[52] U.S. Cl. ......................... 174/260; 361/760; 361/767; 361/768; 361/777; 361/783
[58] Field of Search ..................................... 174/260, 262, 174/263; 361/760, 767, 768, 777, 783

[56] References Cited

U.S. PATENT DOCUMENTS

| | | |
|---|---|---|
| 4,202,007 | 5/1980 | Dougherty et al. ...................... 257/767 |
| 4,598,167 | 7/1986 | Ushifusa et al. ......................... 174/258 |
| 4,912,603 | 3/1990 | Seyama .................................... 361/777 |
| 4,927,983 | 5/1990 | Jones et al. . |
| 5,001,605 | 3/1991 | Savagian et al. . |
| 5,097,593 | 3/1992 | Jones et al. . |
| 5,264,325 | 11/1993 | Allen et al. . |
| 5,424,492 | 6/1995 | Petty et al. . |
| 5,439,766 | 8/1995 | Day et al. . |
| 5,451,721 | 9/1995 | Tsukada et al. . |
| 5,477,933 | 12/1995 | Nguyen . |
| 5,487,218 | 1/1996 | Bhatt et al. . |
| 5,490,040 | 2/1996 | Gaudenzi et al . |

FOREIGN PATENT DOCUMENTS

| | | |
|---|---|---|
| 0 660 405 A2 | 6/1995 | European Pat. Off. . |
| 2-94460 | 5/1990 | Japan . |
| 6-120623 | 5/1994 | Japan . |
| WO 94/18701 | 8/1994 | WIPO . |
| WO 96/08037 | 3/1996 | WIPO . |

*Primary Examiner*—Jeffrey Gaffin
*Assistant Examiner*—Kamand Cuneo
*Attorney, Agent, or Firm*—Patrick J. Daugherty; Driggs, Lucas, Brubaker & Hogg Co., L.P.A.

[57] ABSTRACT

A circuit board is provided which has contacts on the surface arrayed to engage contact pads on a chip carrier bounded by a grid. A plurality of primary through holes are provided in the circuit board location within the grid and electrically connected to chip contact pads thereabove. A plurality of secondary through holes are provided which are located outside the grid and electrically connected to the inside of the chip contact pads. The spacing of the contacts on top of the board is less than the spacing of the contacts on the bottom.

11 Claims, 2 Drawing Sheets

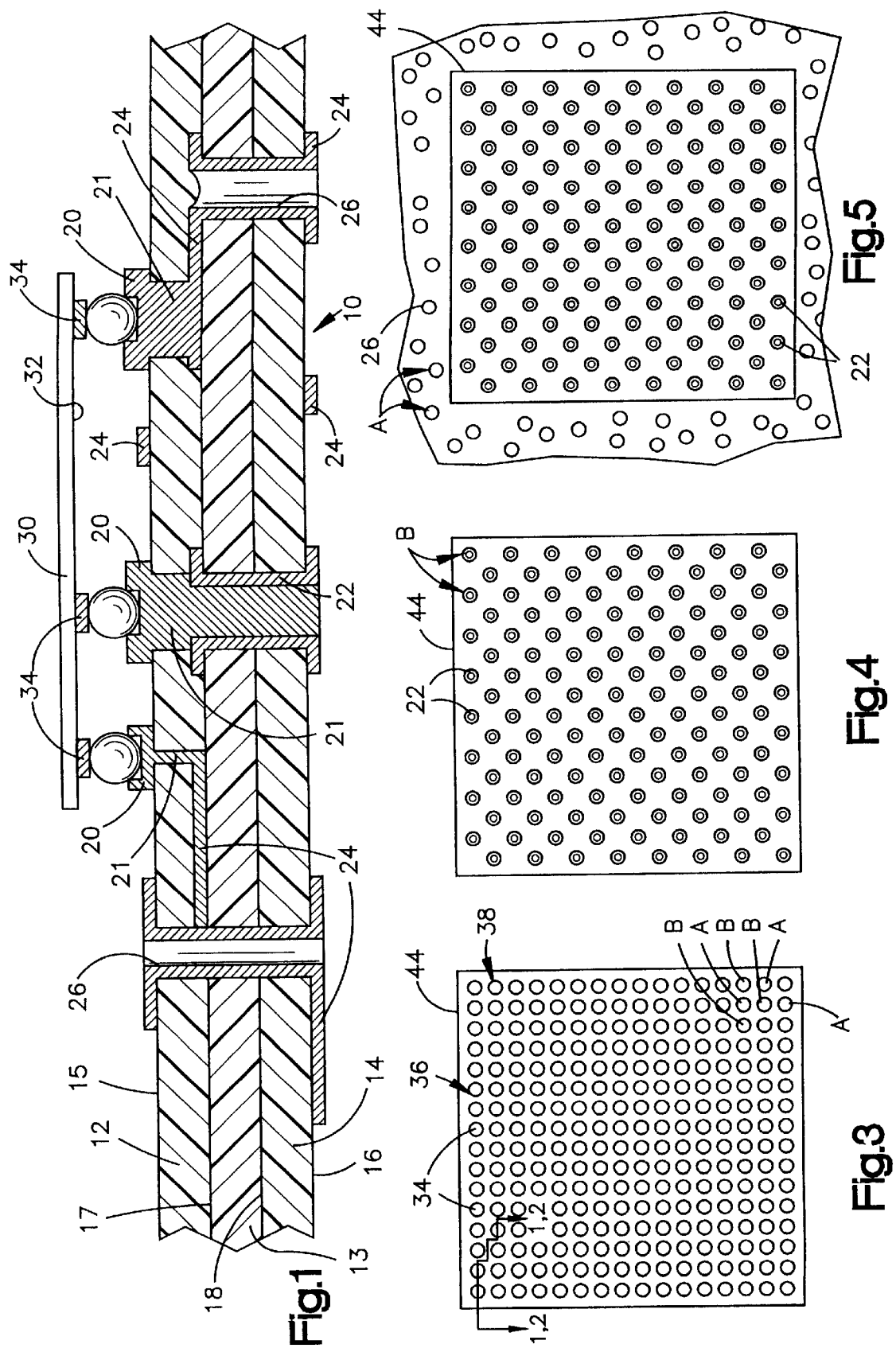

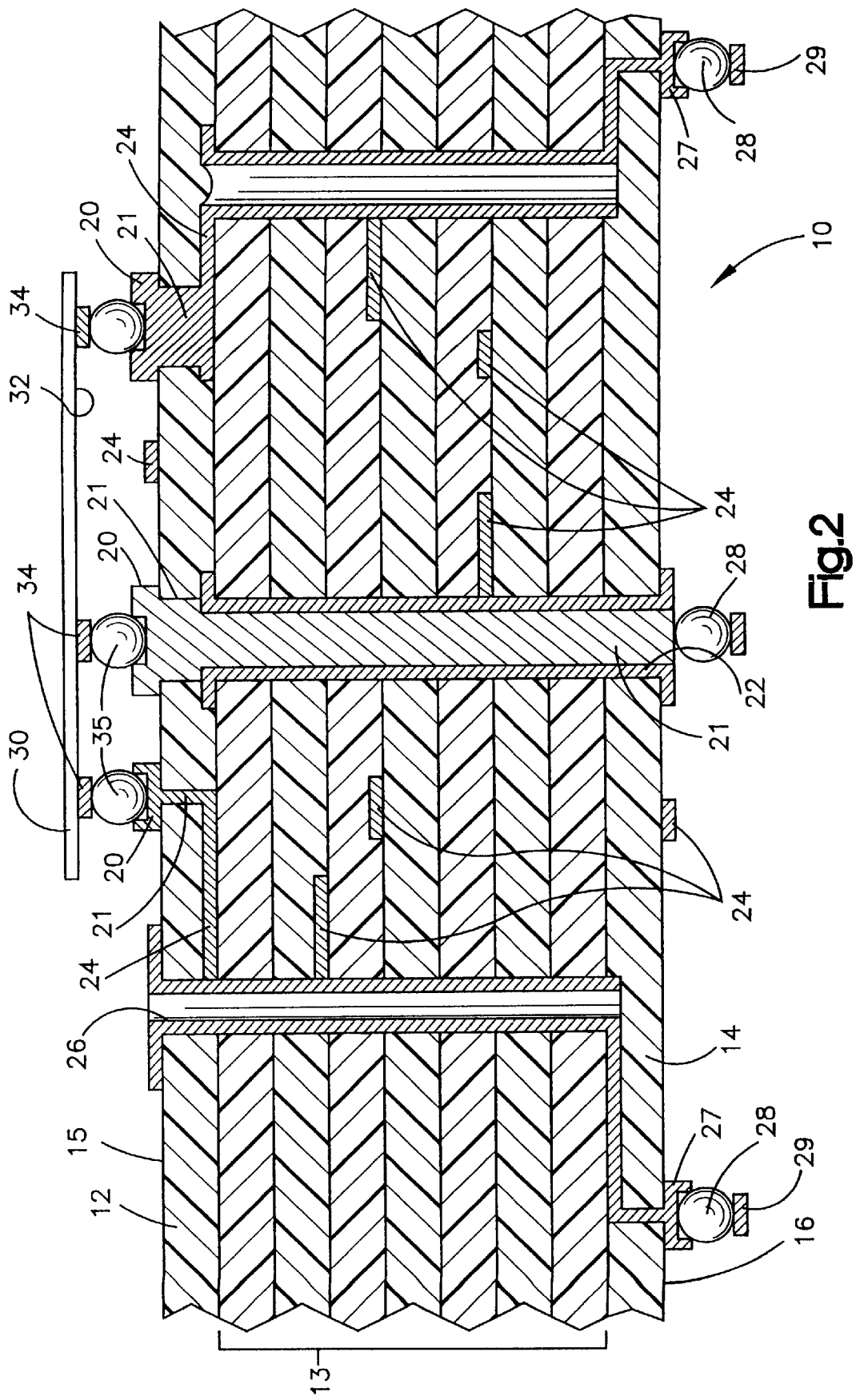

CIRCUIT BOARD WITH PRIMARY AND SECONDARY THROUGH HOLES

BACKGROUND OF THE INVENTION

The present invention relates to an improved multi-layer printed circuit board capable of achieving a high degree of wiring density.

As modern chip carriers become more compact, it becomes ever more difficult to connect the carriers to underlying circuit boards without shorting between adjacent electrical contacts. Accordingly, it is desirable to develop a new design for circuit boards which will allow even greater wiring density than possible in the past.

SUMMARY OF THE INVENTION

In accordance with the present invention, a novel multi-layer circuit board is provided. This circuit board includes primary through holes arranged within the grid defined by the electrical contact pads of the chip carrier, these primary through holes being arranged in an interstitial array corresponding to a subset of the contact pads on the chip carrier. Those contact pads on the carrier not connected to one of these primary through holes are connected to secondary through holes arranged outside the chip carrier grid.

Connecting only some of the chip carrier contact pads to through holes within the grid defined by the chip carrier opens the spacing between adjacent through holes in this area, thereby allowing more traces and wider trace widths, spaces and land sizes to be accommodated in these areas between adjacent through holes. This, in turn, facilitates higher wiring density and flexibility. Connecting the remaining chip carrier contact pads to through holes located outside the chip carrier grid allows denser arrays on the chip carrier, thereby contributing to compactness. As a result, through the use of blind vias, wiring density and flexibility are significantly improved, while overall device compactness is still maintained.

BRIEF DESCRIPTION OF THE DRAWINGS

The present invention may be more readily understood by reference to the following drawings wherein:

FIG. 1 is a schematic longitudinal section taken across the indicated plane in FIG. 3, illustrating a portion of a multi-layer circuit board made in accordance with the present invention, the circuit board having mounted thereon a high density chip carrier;

FIG. 2 is a section view taken across the indicated plane in FIG. 3, similar to FIG. 1 but showing additional layers of dielectric material and circuitry in accordance with this invention;

FIG. 3 is a schematic illustration of the array of electrical contact pads chip carrier on a circuit board;

FIG. 4 is a schematic internal plan view illustrating the array of primary through holes in the circuit board of FIG. 1 which are located within the grid defined by the chip carrier of FIG. 1; and FIG. 5 is a schematic internal plan view similar to FIG. 3 showing the through holes located both inside and outside the interstitial grid.

DETAILED DESCRIPTION

Referring to FIG. 1, a novel multi-layer circuit board in accordance with the present invention, generally indicated at 10, is composed of three layers 12, 13 and 14 of electrical insulating material such as FR4, a glass reinforced epoxy. The layer 12 has an upper surface 15, the layer 14 has a lower surface 16, and two intermediate internal surfaces 17 and 18 are defined between layers 12/13 and 13/14, respectively. In addition, circuit board 10 includes a plurality of contacts 20 on the surface 15 of the substrate. These contacts 20 are arranged in the pattern of the contacts on the I/C chip carrier to be attached, which will be referred to hereinafter sometimes as the grid. Some of the contacts 20 are connected by vias 21 to filled plated through holes 22 directly therebeneath. These holes 22 may terminate at surface 18, or, as shown in FIG. 1, may continue through to surface 16. These holes 22 are sometimes referred to as the primary holes. Others of the contacts 20 are connected by vias 21 to wiring 24 on surface 17 or 18 which, in turn, is connected to plated through holes 26, which can extend entirely through the substrate or extend from any surface 15, 16, 17 or 18 to any other surface. Moreover, wiring traces 24 can be provided on any of the surfaces 15, 16, 17 and 18 to interconnect holes 22, or 26 or vias 21 or pads 20. The spacing of the holes 22 and 26 allows for this wiring as will be explained presently. As will be explained in more detail presently, the plated through holes 22 are located within the grid pattern of the chip carrier, and the plated through holes 26 are located outside the grid pattern. As shown in FIG. 2, element 13 may be comprised of multiple layers of dielectric material and have multiple wiring layers 24 within it that communicate with plated through holes 22 and 26. Contacts 27 on the lower surface 16 are provided to allow solder balls 28 to connect the circuit board 10 to pads 29 on components (not shown). (Similar connections are made with the embodiment of FIG. 1.) This allows for a high density chip carrier to be connected to a substrate surface, and the electrical connections extend from plated through holes spread out beyond interstitial grid pattern allowing more room for wiring on the surfaces 15 and 16 and more room for wiring on the interior of element 13.

Mounted on circuit board 10 is high density chip carrier 30. On its lower surface 32, chip carrier 30 defines a high density array of electrical contact pads 34 arranged within a grid 44 defined by electrical contact pads 34 in the aggregate (see FIGS. 3, 4 and 5). Solder balls 35 connect pads 34 to pads 20. Contact pads 34 are closely packed together in an array and arranged, in the particular embodiment shown, in columns 36 and rows 38 perpendicular thereto (FIG. 3). The contact pads 34 are in the same array as contacts 20 on surface 15 of the substrate.

As further illustrated in FIG. 3, electrical contact pads 34 are arranged in two groups, group A and group B. In particular, electrical contact pads 34 are arranged such that adjacent contact pads in each column, and adjacent contact pads in each row, are in different groups. This is shown in FIG. 3, where it can be seen that the two electrical contact pads 34 which are immediately adjacent "B" electrical contact pad 34 in column 40 are in group A, while the two electrical contact pads 34 which are immediately adjacent "B" electrical contact pads 34 in row 42 are also in group A. The pads of both group A and group B can be connected to surface 17 with blind vias.

In accordance with the present invention, through or primary holes 22 are arranged in an interstitial pattern or array corresponding to the array 32 of electrical contact pads 34 in chip carrier 30. By "interstitial array" is meant that the items in the array are arranged in rows and columns such that the items in one column are offset from the items in adjacent columns by approximately one half the distance between the items in the column. By "corresponding to array 32" is meant that primary through holes 22 align or register with selected electrical contact pads 34 in chip carrier 30—specifically, with "B" electrical contact pads 34 of the chip carrier in the particular embodiment shown.

This is illustrated in FIG. 4 which shows the pattern of primary through holes 22 in circuit board 10 as observed in the middle layer 13. As can be seen from this figure, each of primary through holes 22 is arranged in a column and a row in the same way as electrical contact pads 34 in chip carrier 30. In addition, primary through holes 22 are arranged so as to register with corresponding electrical contact pads 34 in the chip carrier. However, since primary through holes 22 are offset from one another so as to form a corresponding interstitial array, the number of primary through holes 22 is approximately one-half the number of electrical contact pads 34 in the chip carrier. Thus, primary through holes 22 register only with every other electrical contact pad 34 in chip carrier 30—in particular, only with "B" electrical contact pads 34 in chip carrier 30 in the embodiment shown.

With this arrangement, approximately one half of electrical contact pads 34 of chip carrier 30, i.e. all of the "B" contact pads, are electrically connected to primary holes 22 of the circuit board which are directly beneath the B contact pads 34. These holes 22 are contained within grid 44 which is the outer boundary of the connection pads 34 on the chip carrier 30. This leaves approximately half of the remaining electrical contacts of chip carrier 30, i.e. all of the "A" electrical contacts, remaining for electrical connection in another manner. (It is to be understood that more or less than half can be connected to holes 22, but one-half is a typical configuration.)

In accordance with the present invention, these "A" electrical contacts are connected by blind vias 21 to wiring lines or traces 24 and/or multiple additional or second wiring layers not shown on surfaces 15, 16, 17 and 18 to the secondary through holes 26 which are located outside the grid 44. This is illustrated in FIG. 5, which shows that the plated through holes 26 are located outside the interstitial pattern in the grid 44. This can be accomplished in accordance with the present invention by any conventional means. For example, the surface mount technology (SMT) techniques and the blind via techniques described in U.S. Pat. Nos. 5,424,492, 5,451,721 and 5,487,218 can be used for this purpose. The disclosures of these patents are incorporated herein by reference.

Many approaches have been taken in the past for maximizing wiring density. When through holes such as primary through holes 22 become too closely packed, the maximum number and line width of the traces that can be accommodated between adjacent holes become significantly reduced, especially in intermediate planes as well as the lower surface of the circuit board. This is a particular problem where the circuit board is designed so that most if not all of the through vias in the board are formed or "dropped" within the grid of the chip carrier. Arranging some of the through holes in an interstitial array within the grid and others outside it, as described above, greatly lessens this problem as considerably more space is provided between adjacent through holes.

It will therefore be appreciated that arrangement of through holes 26 outside the interstitial array of primary through holes 22 allows sufficient expansion of the spaces between all adjacent through holes in the device. At the same time, it also keeps the device geometry, as a whole, as compact as possible. As a result, the desired goals of higher flexibility and greater density in component wiring is achieved without unduly increasing the overall size of the device. This is of particular advantage in modern electronic components where miniaturization is a continual goal.

Although only a few embodiments of the present invention have been described above, it should be appreciated that many modifications can be made without departing from the spirit and scope of the invention. For example, although the foregoing description has illustrated the interstitial arrays of FIGS. 3 and 4 as being composed of orthogonally-arranged rows and columns, it should be appreciated that an interstitial array can be composed of rows and columns arranged at an acute angle with respect to one another or even arranged in a circle. In addition, it should be appreciated that the holes 26 also can be filled plated-through-hole as are holes 22. All such modifications are intended to be included within the scope of the present invention, which is to be limited only by the following claims:

I claim:

1. A multilayer circuit board and chip carrier assembly for a chip carrier having a high density array of electrical pads arrayed in a grid pattern that optimizes wiring density, said assembly comprising;

a chip carrier having a high density array of electrical pads arrayed in a grid pattern;

a multilayer electrically insulating substrate having upper, lower and internal surfaces;

a plurality of electrical contacts on said upper surface for connecting to the chip carrier electrical pads, wherein said plurality of electrical contacts form a first set of electrical contacts and a second set of electrical contacts and said first set of electrical contacts and said second set of electrical contacts further form an upper surface grid pattern area, said upper surface grid pattern area correlating to the chip carrier electrical pad grid pattern;

a plurality of primary through holes in a primary pattern within said upper surface grid pattern area through said substrate extending from said upper surface to a third set of electrical contacts on said lower surface of said substrate, said third set of contacts electrically connected to said primary through holes and further defining a lower surface grid pattern area, wherein the lower surface grid pattern area is beneath and coextensive with said upper surface grid pattern area, and wherein the average spacing between the lower surface grid pattern area contacts is greater than the spacing between the upper surface grid pattern area contacts;

a plurality of secondary through holes in a secondary pattern through said substrate, said secondary pattern located outside said upper and lower surface grid pattern areas, said secondary through holes extending from one surface of said substrate to another surface on said substrate;

a fourth set of electrical contacts on said lower surface of said substrate connected to said secondary through holes, said fourth set of electrical contacts located outside the lower surface grid pattern area, wherein the third set of connections and the fourth set of connections together define a dispersal pattern area, said dispersal pattern area larger than the chip carrier electrical pad grid pattern area;

wherein the first set of said electrical contacts is connected to said primary through holes and the second set of said electrical contacts is connected to said secondary through holes on a surface of said substrate, wherein each contact of said first set of upper surface electrical contacts is electrically connected to a contact from said third set of lower surface electrical contacts, wherein each contact of said third set of lower surface electrical contacts is directly beneath the contact of said first set of upper surface electrical contacts connected to it; and wherein the secondary through holes are connected to said fourth set of electrical contacts by wiring on one of said upper, lower or internal surfaces of said substrate, thereby electrically connecting each contact of said fourth set of lower surface electrical contacts to a contact from said second set of upper surface electrical contacts, wherein each contact of said fourth set of lower surface electrical contacts is offset and not directly beneath a second set upper surface electrical contact connected to it by the secondary through holes.

2. The assembly of claim 1 wherein said plurality of electrical contacts on said upper surface are arranged such that the electrical contacts form columns and rows and an electrical contact from the first set does not have an electrical contact from the second set directly next to said electrical contact of said first set.

3. The assembly of claim 2 wherein the rows and columns formed by said electrical contacts on said upper surface are orthogonal.

4. The assembly of claim 1 wherein the fourth set of electrical contacts are connected to said secondary through holes by vias.

5. The assembly of claim 1 wherein said secondary through holes stop one layer from said lower surface on said substrate and are connected to said fourth set of electrical contacts on said lower surface of said substrate by a one layer via.

6. The assembly of claim 1 wherein said primary through holes are filled.

7. A method for optimizing wiring density for a multilayer circuit board for receiving a chip carrier having a high density array of electrical contact pads arrayed in a grid pattern, comprising the steps of;

providing a chip carrier having a high density array of electrical contact pads, said pads further defining a grid pattern;

providing a multilayer electrically insulating substrate having upper, lower and internal surfaces;

forming a plurality of electrical contacts on said upper surface for connecting to the chip carrier electrical pads such that said electrical contacts form a first set of electrical contacts and a second set of electrical contacts within an upper surface grid pattern area, said upper surface grid pattern area correlating to the chip carrier electrical pad grid pattern;

forming a plurality of primary through holes in a primary pattern within said upper surface grid pattern area through said substrate extending from said upper surface to a third set of electrical contacts on said lower surface of said substrate, said third set of contacts electrically connected to said primary through holes and further defining a lower surface grid pattern area, wherein the lower surface grid pattern area is beneath and coextensive with said upper surface grid pattern area, and wherein the average spacing between the lower surface grid pattern area contacts is greater than the spacing between the upper surface grid pattern area contacts;

forming a plurality of secondary through holes in a secondary pattern through said substrate, said secondary pattern located outside said upper and lower surface grid pattern areas, said secondary through holes extending from one surface of said substrate to another surface of said substrate;

providing a fourth set of electrical contacts on said lower surface of said substrate, said fourth set of electrical contacts located outside the lower surface grid pattern area, wherein the third set of connections and the fourth set of connections together define a dispersal pattern area, said dispersal pattern area larger than the chip carrier electrical pad grid pattern area;

connecting the first set of said electrical contacts to said primary through holes and connecting the second set of said electrical contacts to said secondary through holes with wiring located on a surface of said substrate, thereby electrically connecting each contact of said first set of upper surface electrical contacts to a contact from said third set of lower surface electrical contacts, wherein each contact of said third set of lower surface electrical contacts is directly beneath the contact of said first set of upper surface electrical contacts connected to it; and connecting the secondary through holes to said fourth set of electrical contacts by wiring on one of said upper, lower or internal surfaces of said substrate, thereby, electrically connecting each contact of said fourth set of lower surface electrical contacts to a contact from said second set of upper surface electrical contacts, wherein each contact of said fourth set of lower surface electrical contacts is offset and not directly beneath a second set upper surface electrical contact connected to it by the secondary through holes.

8. The method of claim 7 wherein said plurality of electrical contacts on said upper surface are arranged such that the electrical contacts form columns and rows and an electrical contact from the first set does not have an electrical contact from the second set directly next to said electrical contact of said first set.

9. The method of claim 8 wherein said electrical contacts on said upper surface form rows and columns that are orthogonal.

10. The method of claim 7 wherein said second set of said electrical contacts are connected to said secondary through holes by vias.

11. The method of claim 7 wherein said secondary through holes stop one layer from said lower surface of said substrate and are connected to said fourth set of electrical contacts on said lower surface of said substrate by a one layer via.

* * * * *

UNITED STATES PATENT AND TRADEMARK OFFICE
CERTIFICATE OF CORRECTION

PATENT NO. : 6,162,997
DATED : December 19, 2000
INVENTOR(S) : Irving Memis

It is certified that error appears in the above-identified patent and that said Letters Patent is hereby corrected as shown below:

Column 1,
Line 54, after "pads" delete "chip carrier 0on a circuit board" and insert -- on a chip carrier --.

Signed and Sealed this

Twenty-third Day of October, 2001

Attest:

*Nicholas P. Godici*

NICHOLAS P. GODICI
*Attesting Officer*    *Acting Director of the United States Patent and Trademark Office*